United States Patent [19]

Lewis et al.

[11] Patent Number: 4,825,340
[45] Date of Patent: Apr. 25, 1989

[54] ELECTRICAL CONDUCTOR ARRANGEMENT

[75] Inventors: Colin B. Lewis; Harold L. Spindley, both of Lincoln, England

[73] Assignee: Marconi Electronic Devices Limited, England

[21] Appl. No.: 157,281

[22] Filed: Feb. 17, 1988

[30] Foreign Application Priority Data

Feb. 19, 1987 [GB] United Kingdom ................ 8703903

[51] Int. Cl.$^4$ ......................... H05K 1/18; H05K 7/02; H05K 7/06; H05K 7/08
[52] U.S. Cl. ...................................... 361/397; 228/122
[58] Field of Search ............... 361/397, 381, 383, 386, 361/388, 395, 384, 387; 428/901; 228/122, 120, 123

[56] References Cited

U.S. PATENT DOCUMENTS 2,934,479  4/1060  Deer .................................. 361/397
3,994,430  11/1976  Cusano et al. .................... 228/122
4,612,601  9/1986  Watari ............................... 361/386

Primary Examiner—Roy N. Envall Jr.
Attorney, Agent, or Firm—Kirschstein, Kirschstein, Ottinger & Israel

[57] ABSTRACT

Electrical conductor arrangement consists of a lamina of ceramic, such as alumina, which has copper foils bonded to both faces. The foils are of different thicknesses, and they are bonded at a high temperature, so that on cooling the ceramic lamina adopts a curved profile. By mounting the lamina with the convex surface mounted towards a heat sink, it can be clamped at its edges to ensure a good thermal contact over the whole of its surface.

6 Claims, 1 Drawing Sheet

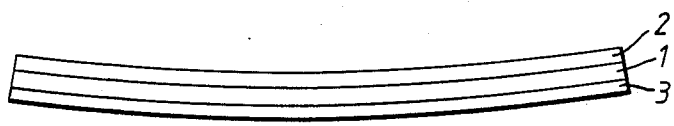
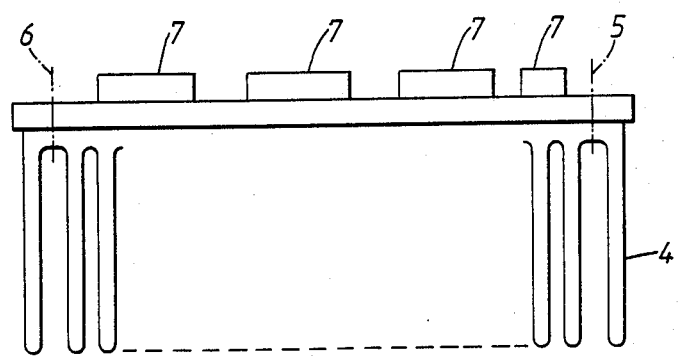

ELECTRICAL CONDUCTOR ARRANGEMENT

BACKGROUND OF THE INVENTION

1. Field of the Invention

This invention relates to an electrical conductor arrangement and is particularly applicable to such arrangements in which a thin conductive metal foil is carried by an insulating substrate to which it is bonded.

2. Description of Related Art

In order to make an electrical conductor arrangement which forms part of an electrical circuit and/or interconnection it has been proposed to bond a foil of copper to a thin lamina of ceramic. Such an arrangement is often intended to serve as a mounting for electrical components which form part of an electrical circuit constituted by the foil and which generate a considerable amount of heat. In order to prevent the arrangement overheating, it is desirable to couple it to a heat sink in a manner which achieves a good thermal path. It has proved difficult to attach an electrical circuit arrangement of this kind to a heat sink in a simple manner which results in a reliable heat transfer. The present invention seeks to provide an improved arrangement.

SUMMARY OF THE INVENTION

According to this invention an electrical conductor arrangement includes a thin lamina of ceramic having metallic foils bonded directly to each of its opposite major faces, the foil on one side being thicker than the foil on the other so as to urge the surface of the thinner foil towards a convex shape. The sandwich so formed is preferably attached to a heat sink by clamping the outer surface of the thinner foil directly on to a flat part of the heat sink. By securing the circuit assembly at each peripheral region of the curved portion one can ensure a close thermal contact over the entire surface area of the thinner foil with the heat sink. This results in an extremely good thermal transfer and can be achieved in a very simple manner. Preferably the foils are copper and as a thin copper foil has a soft readily deformable surface, it can comply with any minor imperfections in the surface of the heat sink. The extent to which the convex shape is produced is determined largely by the relative thicknesses of the two copper foils, although of course, the degree of curvature will decrease for thicker laminas of ceramic and these will tend to deform less readily.

BRIEF DESCRIPTION OF THE DRAWINGS

The present invention is further described by way of example, with reference to the accompanying drawings, in which:

FIG. 1 illustrates a circuit assembly, and

FIG. 2 illustrates an electrical conductor arrangement in which the circuit assembly is mounted upon a heat sink.

DETAILED DESCRIPTION OF THE PREFERRED EMBODIMENT

Referring to FIG. 1, there is shown therein a thin ceramic substrate of alumina 1 having two copper foils 2 and 3 bonded to its opposite major surfaces. Typically, the thickness of the substrate is about 0.6 mm and the thickness of the copper foil 2 is about 0.5 mm and that of the copper foil 3 is about 0.4 mm. Ideally, the ceramic substrate is as thin as possible consistent with a sufficient mechanical strength. The copper can be directly bonded to both sides of the ceramic substrate simultaneously using well known direct bonding techniques. Briefly, in this technique both copper foils are placed against the ceramic and heated to about 1070° C. so as to form on cooling a eutectic bond which results from the setting of a liquid phase caused by the raising of the copper to the correct temperature. Care must be taken not to exceed the melt temperature of copper of 1084° C. The eutectic solidifies at about 1068° C., so precise control of temperature is required. The resulting mechanical bond with the ceramic is extremely strong. Because the process involves the application of heat it is found that by correctly choosing the relative thicknesses of the two copper foils, a slight curve results when the circuit assembly cools down after the bonding process. Since it is possible that the upper foil 2 will not be a continuous foil but will represent a circuit pattern to which components can be attached, this aspect must be taken into account when determing the relative thicknesses of the foils. Thus, if a relatively large area of the copper foil is not present so as to provide electrical isolation between different parts of the electrical circuit of which the foil forms a part, it may be necessary to significantly increase the foil thickness so as to achieve the necessary degree of curvature. Preferably, however, a required circuit pattern is etched into the copper foil after it has been bonded to the ceramic.

Typically, the circuit arrangement shown in FIG. 1 will carry a number of electronic components which in operation dissipate a significant amount of heat. For example, these components may be electrical switching devices such as thyristors, or they can consist of logic gates having a very high packing density. In any event, the copper foil itself is likely to be quite insufficient to conduct heat away from these components so as to hold their temperature at a sufficient low level.

Subsequently, the circuit arrangement is clamped to a metallic finned heat sink 4 by means of bolts passing through respective attachment holes of which only two such holes 5 and 6 are shown. Typically, the ceramic substrate 1 will be of rectangular shape, and in this event a bolt would be attached to each of its four corners so as to secure it firmly to the heat sink, and additional fixing bolts are used depending on the area of the substrate. It will be apparent that in this aspect the curvature of the circuit assembly will occur in both directions in the plane of the substrate so as to constitute a two dimensional convex surface. As the bolts at positions 5 and 6 are tightened down the ceramic is deformed back into its original flat surface, but as it does so it exerts a significant pressure over its entire surface where it contacts the heat sink. This ensures a very good thermal contact. The degree of thermal contact can be controlled to a certain extent by choosing the original degree of convex curvature, but obviously, an excessive degree of curvature may result in damage to the circuit assembly as it is secured to the heat sink.

In this way, circuit components 7 can readily conduct their heat via the two copper foils, which are good conductors of heat, and the thin ceramic substrate to the heat sink 4.

We claim:

1. An electrical conductor arrangement, comprising:
   (a) a thin lamina of ceramic having opposite major surfaces;
   (b) a first metallic foil bonded directly at an elevated temperature to one of said major surfaces of the ceramic lamina, and having a predetermined thickness;

(c) a second metallic foil bonded directly at an elevated temperature to the other of said major surfaces of the ceramic lamina, and having a thickness which is less than said predetermined thickness of the first foil;

(d) said foils and the ceramic lamina therebeteween forming a sandwich structure having a curved shape upon cooling of the foils from said elevated temperatures; and (e) said second foil having an outer convex surface, and said first foil having an outer concave surface.

2. An arrangement as claimed in claim 1; and further comprising a heat sink having a generally planar face clamped against, and acting to flatten, said outer convex surface of the second foil to insure an intimate thermal contact between said generally planar face of the heat sink and the second foil.

3. An arrangement as claimed in claim 2 and wherein the ceramic lamina is secured to the heat sink at peripheral regions of the lamina.

4. An arrangement as claimed in claim 1 and wherein the metallic foils are copper.

5. An arrangement as claimed in claim 1 and wherein the ceramic is alumina.

6. An arrangement as claimed in claim 1 and wherein each metallic foil is bonded to the ceramic lamina by means of a eutectic bond formed by heating the respective foil to just below its melt temperature while in contact with the ceramic lamina.

* * * * *